United States Patent [19]

Okita

[11] Patent Number: 4,866,000
[45] Date of Patent: Sep. 12, 1989

[54] FABRICATION METHOD FOR SEMICONDUCTOR INTEGRATED CIRCUITS

[75] Inventor: Yoshihisa Okita, Tokyo, Japan

[73] Assignee: Oki Electric Industry Co., Ltd., Tokyo, Japan

[21] Appl. No.: 245,297

[22] Filed: Sep. 16, 1988

[30] Foreign Application Priority Data

Sep. 16, 1987 [JP] Japan .................. 62-229746

[51] Int. Cl.[4] ............................ H01L 29/72
[52] U.S. Cl. ..................... 437/31; 437/162; 437/909; 357/34; 357/59
[58] Field of Search ............... 437/31, 32, 33, 162, 437/909, 917; 357/34, 35, 23.4, 43; 148/DIG. 10, DIG. 11

[56] References Cited

U.S. PATENT DOCUMENTS

| | | | |
|---|---|---|---|
| 4,492,008 | 1/1985 | Anantha et al. | 437/917 |
| 4,693,782 | 9/1987 | Kikuchi et al. | 357/34 |
| 4,735,912 | 4/1988 | Kawakatsu | 437/162 |
| 4,749,663 | 6/1988 | Okita . | |

FOREIGN PATENT DOCUMENTS 62-290173 12/1987 Japan .

Primary Examiner—Brian E. Hearn
Assistant Examiner—Tuan Nguyen
Attorney, Agent, or Firm—Wenderoth, Lind & Ponack

[57] ABSTRACT

In method of fabricating a bipolar transistor on a semiconductor substrate, the emitter pattern is formed using the horizontal etching effect and filling-in effect of the RF-bias sputtering method, so a fine, self-aligned emitter pattern can be created that is disposed entirely in the center of the active base region without the use of photoetching. In addition, the passive base layer and the emitter layer can approach each other to any desired degree as long as they do not touch, so no high-concentration base layer is necessary, the base resistance is reduced, and the passive base region is reduced to a very small size. Furthermore, after the formation of the base region, the only heat treatment step that alters the diffusion layer profile is the formation of the emitter layer, so the use of a thin epitaxial layer to reduce the collector resistance does not result in proximity of the buried collector layer and the passive base layer.

27 Claims, 11 Drawing Sheets

F I G. 2I
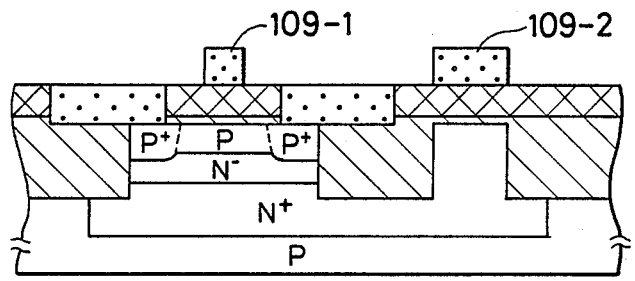
F I G. 2J
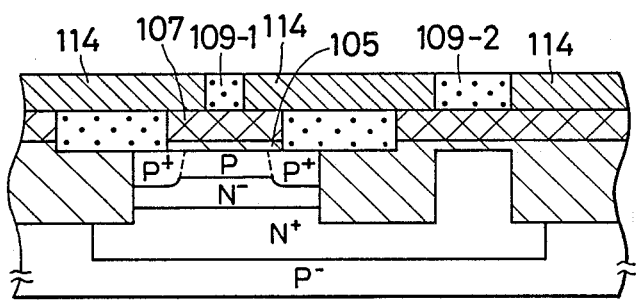
F I G. 2K
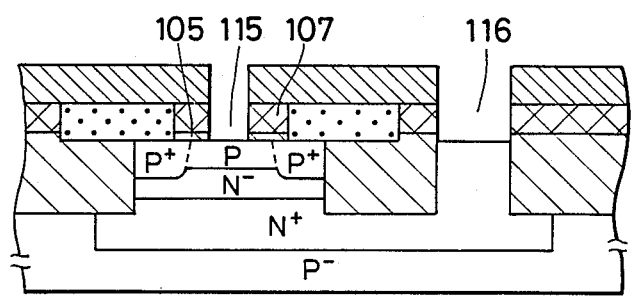

ANGLE BETWEEN THE PATTERN SURFACE AND THE SUBSTRATE SURFACE (DEG)

ANGLE BETWEEN THE BSQ SURFACE AND THE SUBSTRATE SURFACE (DEG)

FABRICATION METHOD FOR SEMICONDUCTOR INTEGRATED CIRCUITS

BACKGROUND OF THE INVENTION

This invention relates to a method of fabricating semiconductor integrated circuits, more particularly to a method of forming bipolar semiconductor integrated circuits in which the emitter region is self-aligned with the base region.

A prior example of this type of fabrication method is disclosed in Japanese Patent Application No. 1986/131698, and will be described with reference to the sectional process diagrams in FIG. 1A through FIG. 1G.

First, as shown in FIG. 1A, known techniques are used to form an $N^+$-type buried collector layer 2, an $N^-$-type epitaxial layer 3, an isolation region 4, and a collector sink layer 5 on a $P^-$-type silicon substrate 1; then a polysilicon film 7 and an oxidation-resistant film 8 are deposited, in this sequence.

Next, as shown in FIG. 1B, photo-etching is used to form photo-resist patterns $80_1$ to $80_3$ and oxidation-resistant patterns $8_1$ to $8_3$; these patterns are used as masks for boron ion implantation into the polysilicon film 7; then after the photoresist 80 is removed, a heavily-doped base layer $6_2$ is created by heat treatment.

Then, as shown in FIG. 1C, the polysilicon film 7 is selectively oxidized so that the polysilicon films $7_1$, $7_2$, and $7_3$ that will become the electrodes of the transistor are individually separated by a silicon oxide film 9.

Next, as shown in FIG. 1D, the oxidation-resistant patterns $8_1$ to $8_3$ are removed, and after the surfaces of the polysilicon films $7_1$, $7_2$, and $7_3$ have been thinly oxidized, boron is introduced through the afore-mentioned oxide film into the polysilicon $7_1$, using photoresists $80_5$ and $80_6$ patterned by photo-etching as a mask; then after the resists $80_5$ and $80_6$ have been removed, boron ions are implanted over the entire surface.

Then, as shown in FIG. 1E, heat treatment is carried out in a non-oxidizing atmosphere to diffuse the boron out of the polysilicon $7_1$ and $7_2$ and form a passive base layer 10 and an active base layer $6_1$, after which contact holes $12_1$ to $12_3$ are opened.

Next, as shown in FIG. 1F, the polysilicon surface in the contact hole areas is thinly oxidized using photoresists $80_9$ to $80_{11}$ that have been patterned by photo-etching as a mask, arsenic ions are implanted into the polysilicon films $7_2$ and $7_3$ over the emitter region and over the collector electrode contact.

Then, as shown in FIG. 1G, after the photoresists $80_9$ to $80_{11}$ have been removed, heat treatment is carried out in a non-oxidizing atmosphere to form an emitter layer 11 in the active base layer $6_1$.

In this prior-art fabrication method, however, in order to self-align the emitter region and the active base region, the chip is structured so that the active base region is surrounded by a thick silicon oxide film. A heavily-doped base layer is therefore needed to make electrical contact between the active base layer and the passive base layer that interfaces with the base electrode, and the resistance of this base must be reduced in order to improve the switching speed of the transistor. It is therefore necessary to reduce the resistance of the heavily-doped base layer by raising the dopant concentration in the heavily-doped base layer. An extremely high dopant concentration in the heavily-doped base layer creates the following difficulties, thus limiting the attainable switching speed of the transistor.

(A) The heavily-doped base layer is widened by the heat treatment (selective oxidation, active base layer formation, and emitter layer formation) after forming the heavily-doped base layer. This has the following effects (A-1) to A-3):

(A1) The area that faces the buried collector layer is increased, thus increasing the base-collector capacitance. It thus limits the switching speed of the transistor.

(A-2) The heavily-doped base layer is brought into contact with the emitter layer, increasing the base-emitter junction capacitance. It thus limits the switching speed of the transistor.

(A-3) The area of the active base layer is reduced, degrading the current gain of the transistor.

(B) The junction of the heavily-doped base layer is deepened by the heat treatment (selective oxidation, active base layer formation, emitter layer formation) after the formation of the heavily-doped base layer. Accordingly, if the thickness of the epitaxial layer is reduced to reduce the collector resistance and improve the switching speed of the transistor, the collector-base breakdown voltage is reduced.

SUMMARY OF THE INVENTION

An object of the present invention is to remove the limits imposed on the switching speed of the transistor by the existence of the heavily-doped base layer in regard to the points listed above, and provide a fabrication method for semiconductor integrated circuits in which small, highspeed, high-performance transistors can be made easily and with high reproducibility.

To achieve a solution to the problems stated above, this invention provides a method of fabrication of semiconductor integrated circuits, comprising the steps of:

(a) forming a first film (105) on the surface of a region which is to become an active region on a semiconductor substrate having a first type of conductivity;

(b) implanting a first dopant through the first film (105) to impart the first type of conductivity to the surface region of the active region;

(c) forming a second film (107) on the surfaces of the active region;

(d) selectively removing part (108) of the second film (107) and the first film (105) on a region which is to become a base electrode region (119);

(e) forming a third film (109) on the surface of the active region to form a concavity at the base electrode region and convexes at regions which are to become emitter and active base regions (118, 110);

(f) implanting a second dopant into the third film (109);

(g) diffusing the second dopant from the third film (109) into part or all of the active region;

(h) forming a fourth film (112) by an RF-bias sputtering in the concavity formed in the preceding step (e) and the central part of the convexity formed in the preceding step (e), the central part of the convexity being positioned directly over the emitter region (118);

(i) removing the fourth film (112) formed in regions outside the active region to leave the fourth film (112) over the emitter region (118), the base electrode region (119) and the collector electrode contact region (121);

(j) selectively removing those parts of the third film (109) that are not covered by the fourth film (112) and are disposed above the surface of the second film (107);

(k) removing the fourth film (112) to leave convexes (109-1, 109-2) over the emitter region (118) and at the collector electrode contact region (121) and a concavity between these convexes;

(l) forming a fifth film (114) by an RF-bias sputtering in the concavity left by the preceding step (k) such that the surface of the third film (109) is exposed;

(m) selectively removing the part of the third film (109) not covered by the fifth film (114), the parts of the second film (107), and the first film (105) under the part of the third film (109) to form windows (115, 116) exposing the emitter region (118) and the collector electrode contact region (112);

(n) forming a sixth film (117) on the surface of the active region;

(o) doping a third dopant into the sixth film (117), the third dopant forming a second type of conductivity;

(p) selectively removing that portion of the sixth film (117) disposed above the surface of the second film (107); and (q) diffusing the third dopant from the sixth film (117) into part or all of the active region to impart the second type of conductivity to the active region.

In this invention, the emitter pattern is formed using the horizontal etching effect and filling-in effect of the RF-bias sputtering method, so a fine, self-aligned emitter pattern can be created that is disposed entirely in the center of the active base region without the use of photo-etching. In addition, the passive base layer and the emitter layer can approach each other to any desired degree as long as they do not touch, so no high-concentration base layer is necessary, the base resistance is reduced, and the passive base region is reduced to a very small size. Furthermore, after the formation of the base region, the only heat treatment step that alters the diffusion layer profile is the formation of the emitter layer, so the use of a thin epitaxial layer to reduce the collector resistance does not result in proximity of the buried collector layer and the passive base layer.

DETAILED DESCRIPTION OF THE EMBODIMENTS

An embodiment of the semiconductor integrated circuit fabrication of this invention will be explained with reference to the sectional process diagrams in FIGS. 2A through 2N.

Figure 1A:
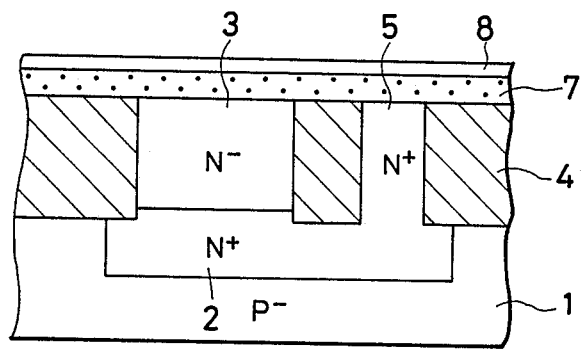
FIG. 1A through FIG. 1G are cross-sectional drawings illustrating the process of the prior art.
Figure 1B:
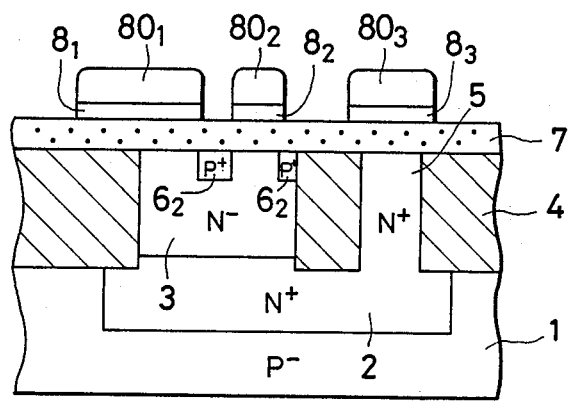
Figure 1C:
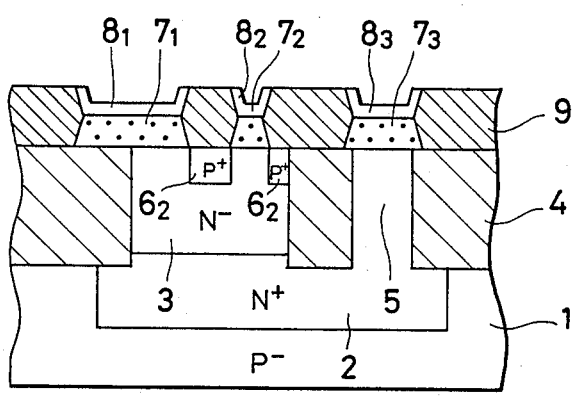
Figure 1D:
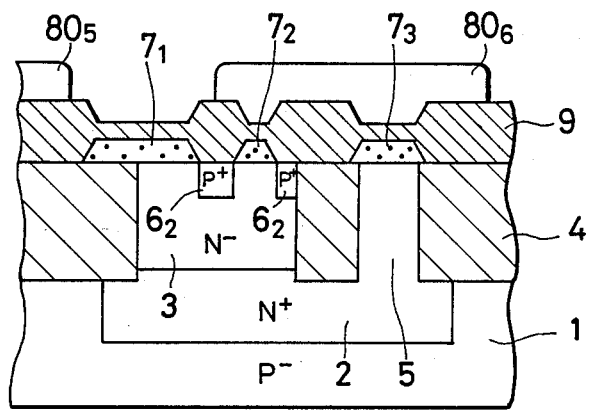
Figure 1E:
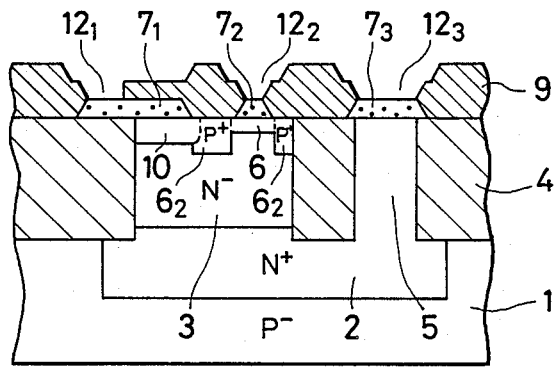
Figure 1F:
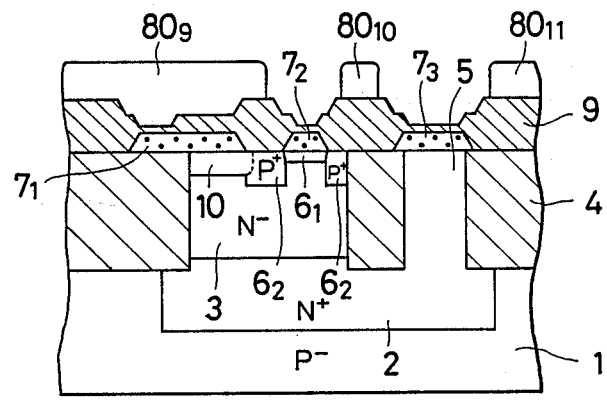
Figure 1G:
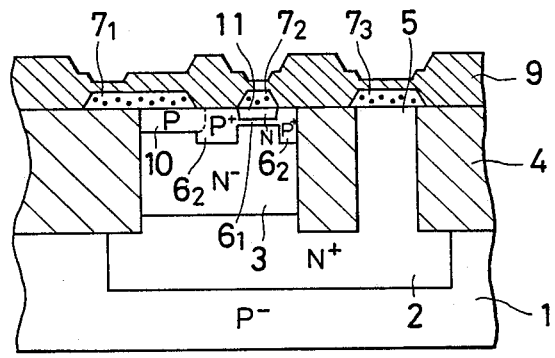
Figure 2A:
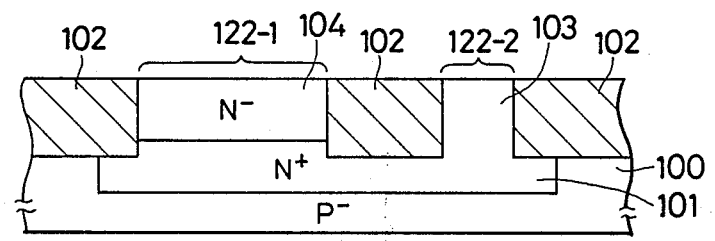
FIG. 2A through FIG. 2N are cross-sectional drawings illustrating the process of an embodiment of the present invention.

First, as shown in FIG. 2A, well-known techniques are used to form an $N^+$-type buried collector layer 101, an isolation region 102, a collector sink layer 103, and an $N^-$-type epitaxial layer 104 on a $P^-$-type silicon substrate 100, and to expose active semiconductor surfaces 122-1 and 122-2.

Figure 2B:
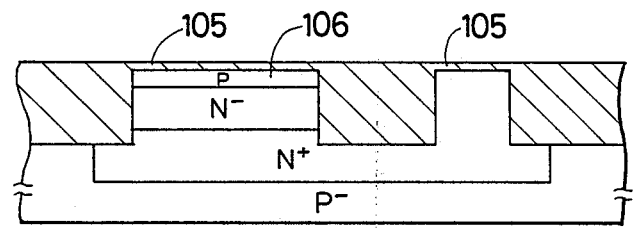

Next, as shown in FIG. 2B, a thermal oxidation is used to form a silicon oxide film 105 of approximately 500Å on the active semiconductor surfaces 122-1 and 122-2, and an ion implantation technique is used to implant an acceptor dopant such as boron ions over the entire surface. The amount of dopant implanted is sufficient to form a P-type diffusion layer 106 in the region directly below the active semiconductor surface 122-1.

Figure 2C:
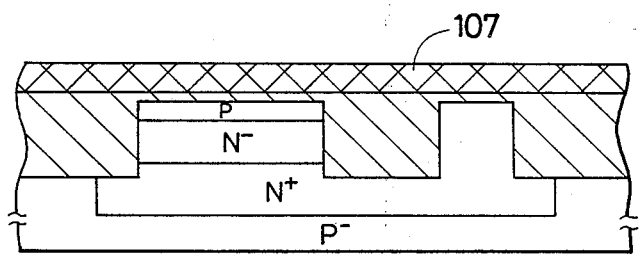

Then, as shown in FIG. 2C, a silicon nitride film 107 of approximately 2000Å is formed using a vapor-phase chemical growth process.

Figure 2D:
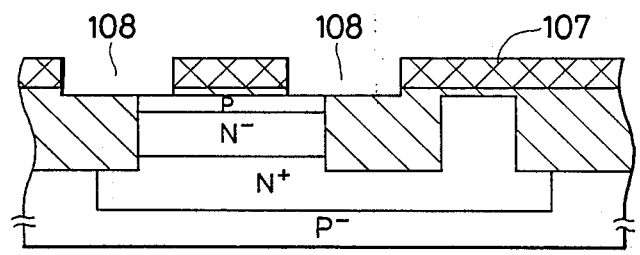

After that, as shown in FIG. 2D, a known photo-etching process is used to selectively remove the silicon nitride film 107 and the silicon oxide film 105 over the base electrode contact regions 108.

Figure 2E:
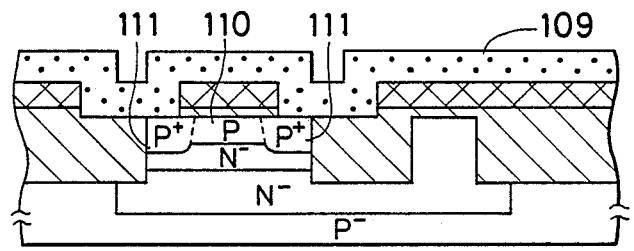

Next, as shown in FIG. 2E, the entire surface is covered with a firth polysilicon film 109 approximately 2500Å thick by a vapor-phase chemical growth. An ion implantation technique is used to implant an acceptor dopant such as boron ions into this first polysilicon film 109, and heat treatment is performed in a non-oxidizing atmosphere to form a passive base layer 111 and to simultaneously diffuse the acceptor dopant implanted in FIG. 2B, thereby forming an active base layer 110.

Figure 2F:
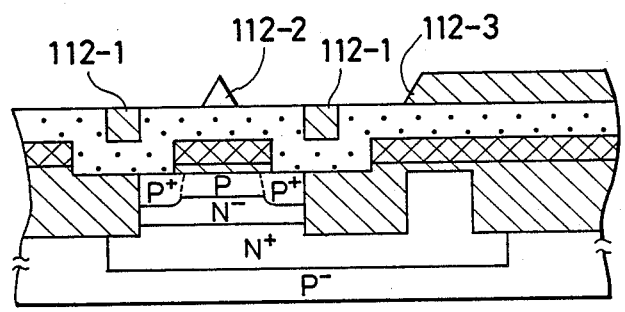

Subsequently, as shown in FIG. 2F, a first sputtered silicon oxide film 112 of approximately 2500Å is deposited by an RF-bias sputtering technique. The RF-bias sputtering is a process in which sputtering and deposition are effected concurrently. Details of this process will be later described with reference to FIG. 3 to FIG. 9. The conditions of the RF-bias sputtering so set that sputtered silicon oxide film (first silicon oxide film) 112 is formed in the concavities 112-1 of the first polysilicon film 109, in the central region 112-2 over the active base region and over the isolation region 112-3 between adjacent devices.

Figure 2G:
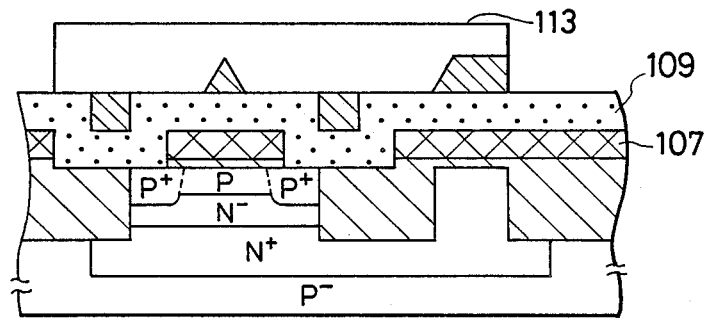

Subsequently, as shown in FIG. 2G, by means of a photo-etching technique the first sputtered silicon oxide film 112 selectively removed from regions outside the transistor area using a photoresist 113.

Figure 2H:
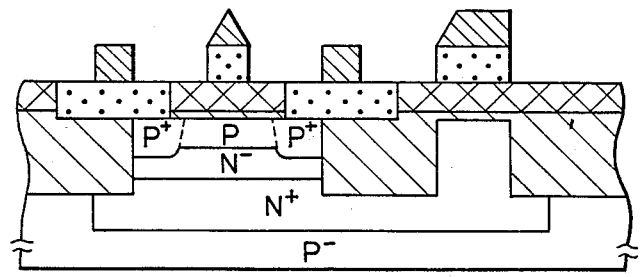

Next, as shown in FIG. 2H, an etch-back process is performed on the first polysilicon film 109 using an anisotropic etching technique with the remaining first sputtered silicon oxide film 112 as a mask. This etch-back process is stopped at the point at which the surface of the silicon nitride film 107 is exposed. During this process, the first sputtered silicon oxide film 112 in the concavities serve to prevent etching of polysilicon beneath them which later serves as lead conductor between the passive base and the polysilicon region at which a metal conductor is contacted through a contact hole.

Then, as shown in FIG. 2I, the first sputtered silicon oxide film 112 is completely removed.

After that, as shown in FIG. 2J, an RF-bias sputtering technique is used to fill areas between the polysilicon layer 109-1 above the emitter region and the polysilicon layer 109-2 above the collector electrode contact region with a second sputtered silicon oxide film 114 approximately 2500Å thick. The RF-bias sputtering conditions should be set so that a layer of silicon oxide is not grown over the polysilicon regions 109-1 and 109-2.

Next, as shown in FIG. 2K, anisotropic etching with the second sputtered silicon oxide film 114 as a mask is used to selectively remove the polysilicon regions 109-1 and 109-2 and the silicon nitride film 107 directly below them; then the thin silicon oxide film 105 which is thus exposed is removed by a wet etching process, thereby opening an emitter diffusion window 115 and a collector electrode contact window 116.

Figure 2L:
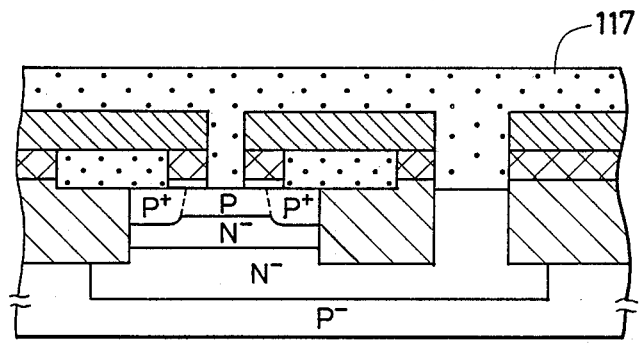

After that, the entire surface is covered with a second polysilicon film 117 as shown in FIG. 2L. The thickness of the second polysilicon film 117 is approximately 60% of the length of the short side of the collector electrode contact window 116. The emitter diffusion window 115 and the collector electrode contact window 116 are completely filled in by the second polysilicon film 117. Then a donor dopant such as arsenic or phosphorus is diffused into the entire surface of the second polysilicon film 117. The diffusion should preferably be performed by ion implantation at a short time under a low temperature heat treatment so that the donor dopant diffuses only into the second polysilicon film 117.

Figure 2M:
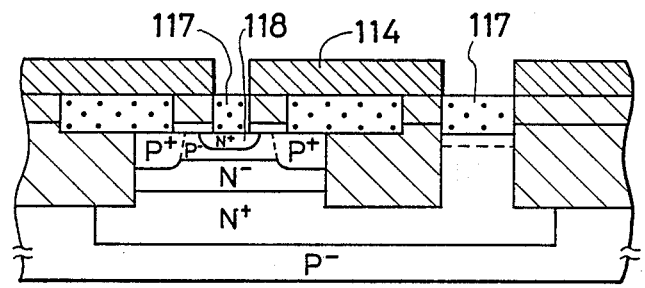

Next, as shown in FIG. 2M, an etch-back process is performed using anisotropic etching until the remaining thickness of the second polysilicon film 117 is 2500Å, and heat treatment is performed in a non-oxidizing atmosphere to form an emitter layer 118.

Figure 2N:
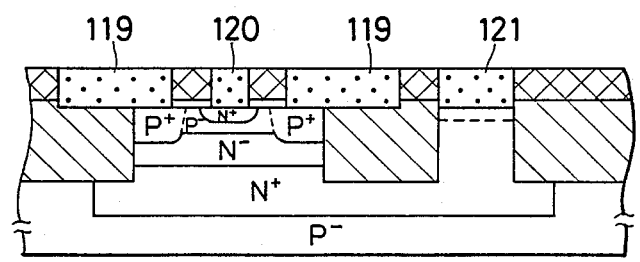

After that, as shown in FIG. 2N, the second sputtered silicon oxide film 114 is completely removed to expose the base electrode 119, the emitter electrode 120, and the collector electrode 121, completing a finely-patterned bipolar transistor with a flat surface.

The RF-bias sputtering technique used in the steps of FIG. 2F and FIG. 2J will now be described.

Figure 3:
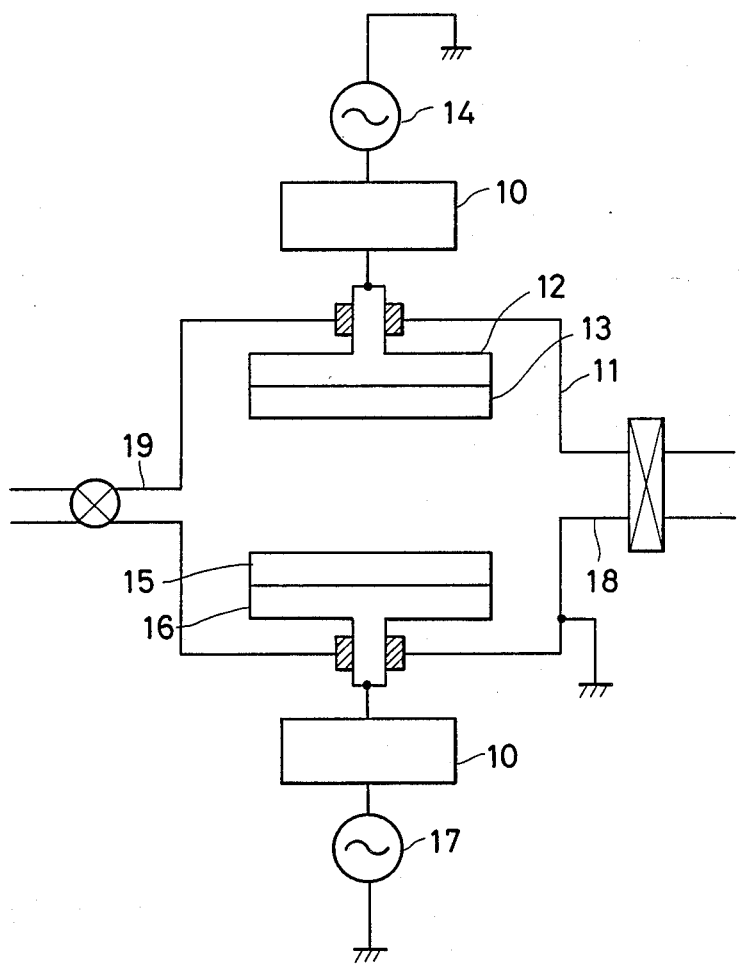
FIG. 3 is a schematic view showing a general construction of an RF-bias sputtered film forming apparatus.

FIG. 3 is a schematic view showing an example of RF-bias sputtering apparatus. As illustrated, a substrate 13 and a target 15 are electrically connected through a substrate electrode 12 and a target electrode 16 to a substrate RF power supply 14 and a target RF power supply 17.

For the formation of RF-bias sputtered film (BS film), the chamber 11 is evacuated through an exhaust port 18 while at the same time Ar gas is introduced through an Ar inlet 19 to make the degree of vacuum into the order of $10^{-3}$ to $10^{-2}$ Torr. The substrate RF power supply 14 and the target RF power supply 17 are both made operative, by which both sputter deposition and sputter etching are made to take place concurrently on the substrate 13.

Figure 4:
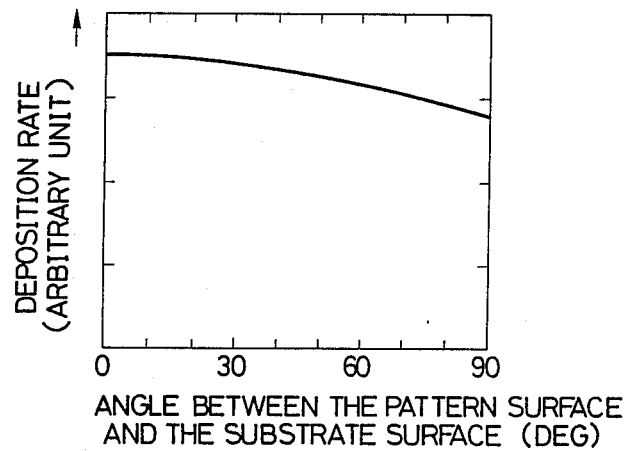
FIG. 4 is a diagram showing the deposition rate versus the angle between the pattern surface and the substrate surface.

FIG. 4 shows a characteristic of deposition rate versus the angle between the surface of the film that is deposited or etched by the RF-bias sputtering (pattern surface) and the surface of the underlying layer (substrate surface). In FIG. 4, the vertical axis represents the thickness (the dimension in the direction normal to the pattern surface) of the BS film which grows, when the target alone is supplied with the RF power, on the surface of the pattern that is formed in advance on the underlying layer. Here, the thickness of the BS film is defined as the dimension of the film normal to the pattern surface. It is seen from FIG. 4 that the BS film thickness varies with the angle between the pattern surface and the substrate surface.

Figure 5:
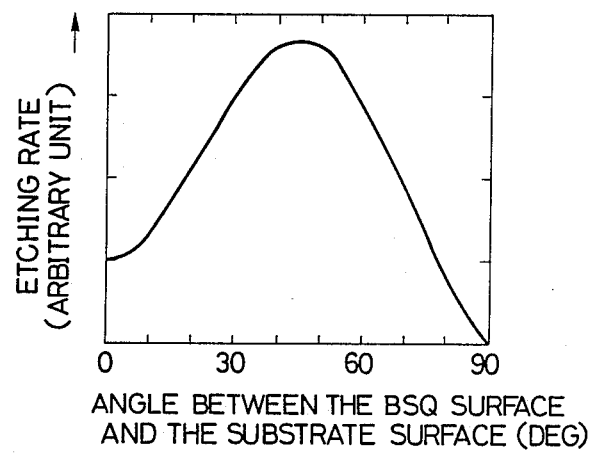
FIG. 5 is a diagram showing the etching rate versus the angle between the RF-bias sputtered film surface and the substrate surface.

FIG. 5 shows the etching rate versus the angle between the BS film surface and the substrate surface. The vertical axis represent the amount of etching (in the direction of the BS film surface) of the BS film that results when the substrate alone is supplied with the RF power, the BS film being formed in advance on the underlying layer. It is seen from FIG. 3 that the amount of etching varies with the angle between the BS film surface and the substrate surface. The maximum etching rate is obtained when the BS film surface angle is 45°.

Actually, to form BS film, the target and the substrate are both supplied with RF power, the dependency of the rate of film thickness growth on the angle is the difference between the values in FIG. 4 and FIG. 5.

To form the layers 112-1 to 112-3 as shown in FIG. 2F, the following process comprising two steps is performed in which the above characteristics are utilized.

Figure 6:
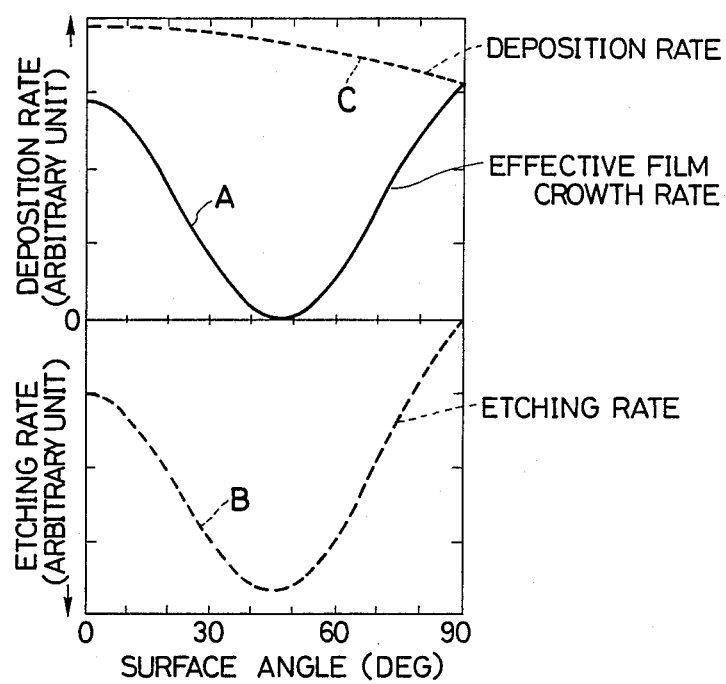
FIG. 6 is a diagram showing the RF-bias sputtered film deposition rate versus the surface inclination.

In the first step, the ratio between the target power and the substrate power is selected in such a way that the rate of effective film growth on a surface 45° inclined with respect to the substrate surface is 0. This is illustrated in FIG. 6, in which the curve C represents the deposition rate, the curve B represents the etching rate and the curve A represents the effective film growth rate which is the difference between the curves C and B.

Figure 7:
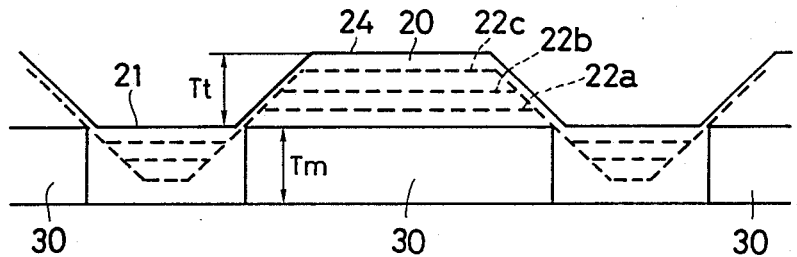
FIG. 7 is a cross-sectional view showing how the RF-bias sputtered film is grown.

When the BS film 20 grown until the thickness Tt of the part of the film having a horizontal surface is equal to the thickness Tm of the underlying pattern, the profile will be as indicated by solid line 21 in FIG. 7. The dashed lines 22a, 22b, 22c in FIG. 7 indicate the profiles in the process of the film growth. It will be seen from FIG. 6 that at the end of the first step, the profile of the BS film has a protrusion 24 over the underlying pattern 30.

Figure 8:
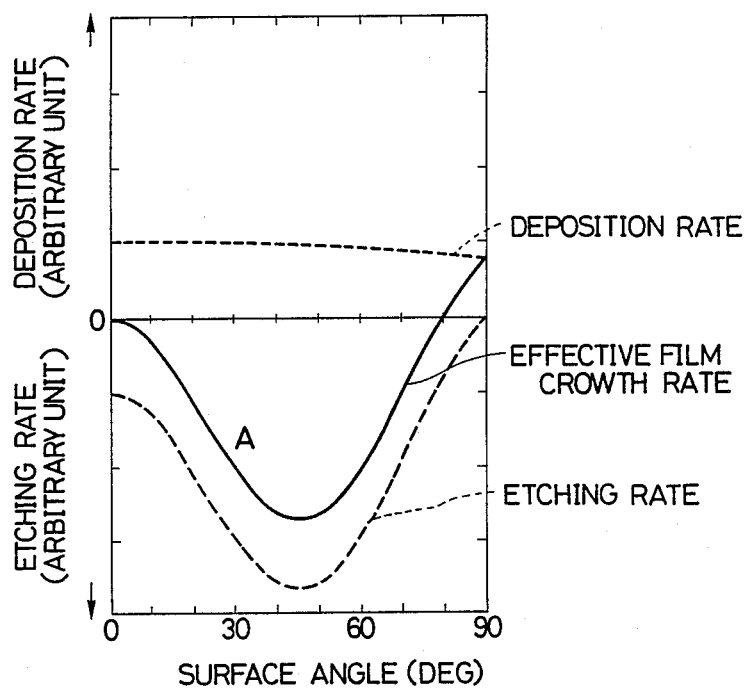
FIG. 8 is a diagram showing the RF-bias sputtered film etching rate versus the surface inclination.
Figure 9:
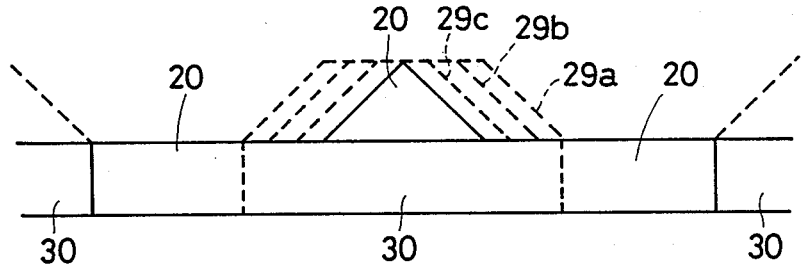
FIG. 9 is a cross-sectional view showing how the RF-bias sputtered film is etched.

In the second step, the ratio between the target power and the substrate power is chosen so that the effective film growth (etching) rate on a horizontal surface is zero. This is illustrated in FIG. 8, in which the curve A represents the effective film growth (etching) rate, the curve B represents the etching rate, and the curve C represents the deposition rate. The etching is performed until the profile of the BS film 20 becomes as indicated in the solid line 28 in FIG. 9, to result in a flat film. The dashed lines 29a, 29b, 29c in FIG. 9 indicate the profiles in the process of etching.

During the second step, the etch-back rate in the horizontal direction of the 45° inclined surface is about 1000Å/min. This is slow enough to permit accurate control over the dimension of the resultant film 112-2 and hence the dimension of the emitter region (118).

To form the layers 114 as shown in FIG. 2J, the same combination of the first and second steps as explained above can be utilized. However, the second step is continued until the part of the film on the layer 109-1 that is formed in the first step is completely removed. This results in a structure shown in FIG. 2J.

Further details of the RF-bias sputtering is disclosed in U.S. Pat. No. 4,794,663 to Okita (the present applicant) which is hereby incorporated by reference.

In this invention as detailed above, the horizontal etching effect and concavity-burying effect of the RF-bias sputtering method is used to form the emitter pattern, so a fine, self-aligned emitter pattern can be created completely in the center of the active base region without using photo-etching. In addition, the passive base layer and emitter layer can be brought into arbitrarily close proximity to each other provided only that they do not make contact, so the switching speed of the transistor can be improved without the adverse effects of a heavily-doped base layer. The passive base region can furthermore be reduced to extremely small size to reduce the base-collector parasitic capacitance and improve the switching speed of the transistor. Moreover, after formation of the base region (active base layer, passive base layer), the only heat treatment step that changes the diffusion profile is the formation of the emitter layer, so the thickness of the epitaxial layer can be reduced to reduce the collector resistance and improve the switching speed of the transistor without causing the passive base layer to approach the buried collector layer. These effects of the invention solve the problems stated earlier.

What is claimed is:

1. A method of fabrication of semiconductor integrated circuits on a semiconductor substrate having a first type of conductivity, comprising the steps of:
   (a) forming a first film (105) on the surface of a region which is to become an active region having a second type of conductivity on said semiconductor substrate;
   (b) implanting a first dopant having the first type of conductivity through said first film (105) in part of the surface region of said active region;
   (c) forming a second film (107) on the surfaces of the structure obtained by the preceding steps;
   (d) selectively removing regions (108) of said second film (107) and said first film (105) on a region which is to become a base electrode region (119);
   (e) forming a third film (109) of polycrystalline silicon on the surface of the structure obtained by the preceding steps; a plurality of concavities being formed on the regions (108) of said third film (109);
   (f) implanting a second dopant into said third film (109);
   (g) diffusing said second dopant from said third film (109) into part or all of said active region;
   (h) forming a fourth film (112) by an RF-bias sputtering in the concavities formed in the preceding step (e), at the central part between said concavities and at a region where a collector electrode contact will be formed, said central part being positioned directly over a region where an emitter will be formed (118), said fourth film (112) being also formed outside of said active region;
   (i) removing said fourth film (112) formed outside of said active region to leave said fourth film (112) over the emitter region (118), the base electrode region (119) and the collector electrode contact region (121);
   (j) selectively removing those parts of said third film (109) that are disposed above the surface of said second film (107) and are not covered by said fourth film (112);
   (k) completely removing said fourth film (112) to leave convexes (109-1, 109-2) over the emitter region (118) and at the collector electrode contact region (121);
   (l) forming a fifth film (114) by an RF-bias sputtering on the structure obtained by the preceding steps, the surface the resultant fifth film (114) being substantially coplanar with the surface of said third film (109);
   (m) selectively removing the part of said third film (109) not covered by said fifth film (114), the parts of said second film (107), and said first film (105) under said part of said third film (109) to form windows (115, 116) exposing the emitter region (118) and the collector electrode contact region (112);
   (n) forming a sixth film (117) on the surface of said active region;
   (o) doping a third dopant into said sixth film (117), said third dopant having a second type of conductivity;
   (p) selectively removing that portion of said sixth film (117) disposed above the surface of said second film (107); and
   (q) diffusing said third dopant from said sixth film (117) into said active region.

2. A method according to claim 1, wherein said active region comprises one or more electrically isolated active islands.

3. A method according to claim 1, wherein
said semiconductor substrate is a silicon substrate;
said first film is a silicon oxide film;
said second film (107) is a silicon nitride film;
said fourth film (112) is a silicon oxide film;
said fifth film (114) is a silicon oxide film; and
said sixth film (117) is a silicon oxide film.

4. A method according to claim 1, further comprising the step of removing said fifth film to obtain an integrated circuit with a substantially flat surface.

5. A method according to claim 3, wherein said step (a) comprises forming the film (105) by thermal oxidation to a thickness of about 500Å.

6. A method according to claim 3, wherein said step (c) comprises performing vapor-phase chemical growth process to form the second film (107) to a thickness of about 2000Å.

7. A method according to claim 3, wherein said step (e) comprises depositing said third film (109) to a thickness of about 2500Å by vapor-phase chemical growth process.

8. A method according to claim 3, wherein said fourth film (112) has a thickness of about 2500Å.

9. A method according to claim 3, wherein said fifth film (114) is has a thickness of about 2500Å.

10. A method according to claim 3, wherein said step (n) comprises depositing the sixth film (117) such that the thickness of the sixth film is a little over half the smaller dimension of the collector contact window.

11. A method according to claim 1, wherein said step (d) comprises:
   (d1) selectively removing regions (108) of said second film (107) over a region which is to become a base electrode region (119); and
   (d2) selectively removing said first film (105) only where exposed by the preceding step (d1).

12. A method according to claim 11, wherein said step (d) comprises performing photo-etching.

13. A method according to claim 1, wherein said step (g) comprises performing heat treatment to diffuse said second dopant from said third film (119) into said active region thereby to form a passive base region (111).

14. A method according to claim 1, further comprising the step of (g') diffusing said first dopant from said first film (105) into said active region directly beneath said first film (105) to form the active base region (110).

15. A method according to claim 14, wherein said steps (g) and (g') are accomplished by heat treatment to diffuse said second dopant from said third film (119) into said active region thereby to form a passive base region (111) and to diffuse said first dopant from said first film (105) into said active region directly beneath said first film (105) to form the active base region (110).

16. A method according to claim 1, wherein said step (h) of forming the fourth film (112) comprises:
   (h1) performing the RF-bias sputtering in such a condition that the rate of effective film growth on an inclined surface is 0; and
   (h2) subsequently performing the RF-bias sputtering in such a condition that the rate of effective film etching on a horizontal surface is 0.

17. A method according to claim 16, wherein said step (h2) of performing the RF-bias sputtering comprises performing the RF-bias sputtering for a predetermined time such that the resultant film on the emitter region is of a desired dimension.

18. A method according to claim 1, wherein said step (i) comprises removing said fourth film (112) by photo-etching.

19. A method according to claim 1, wherein said step (j) comprises performing anisotropic etching on the third film (109) using the fourth film as a mask until the surface of said second film (107) is exposed.

20. A method according to claim 1, wherein said step (l) comprises forming the fifth film (114) such that the surface of the fifth film (114) is substantially flush with the surface of the third film (109).

21. A method according to claim 1, wherein said step (l) of forming the sixth film (117) comprises:
   (l1) performing the RF-bias sputtering in such a condition that the rate of effective film growth on an inclined surface is 0; and
   (l2) subsequently performing the RF-bias sputtering in such a condition that the rate of effective film etching on a horizontal surface is 0.

22. A method according to claim 21, wherein said step (l2) of performing the RF-bias sputtering comprises performing the RF-bias sputtering for a predetermined time such that no film remains on the convex.

23. A method according to claim 1, wherein said step (m) comprises:
   (m1) selectively removing only the part of said third film (109) that is not covered by said fifth film (114);
   (m2) selectively removing only the parts of said second film (107) exposed by the preceding step (m1); and
   (m3) selectively removing only the parts of said first film (105) exposed by the preceding step (m2).

24. A method according to claim 1, wherein said step (n) of forming a sixth film (117) on the surface of said active region comprises completely burying the surface irregularities created by the preceding steps.

25. A method according to claim 1, wherein said step (o) comprises implanting the third dopant into the sixth film (117) and diffusing the third dopant into the sixth film (117) at a low temperature and for a short time so that the third dopant diffuses within said sixth film (117) and does not diffuse out of the sixth film (117).

26. A method according to claim 1, wherein said step (p) comprises performing anisotropic etching on the sixth film (117) until the thickness of the remaining film becomes about 2500A.

27. A method according to claim 1, wherein said step (q) comprises performing heat treatment in a non-oxidizing atmosphere to diffuse said third dopant from said sixth film (117) into part or all of said active region to impart the second type of conductivity to said active region thereby to form the emitter region (118).

* * * * *